US011441046B2

(12) United States Patent
Wall et al.

(10) Patent No.: US 11,441,046 B2
(45) Date of Patent: Sep. 13, 2022

(54) SOLDER MASK INKJET INKS FOR MANUFACTURING PRINTED CIRCUIT BOARDS

(71) Applicants: AGFA-GEVAERT NV, Mortsel (BE); ELECTRA POLYMER LTD., Tonbridge (GB)

(72) Inventors: Christopher Wall, Mortsel (BE); Clive Landells, Mortsel (BE)

(73) Assignees: AGFA-GEVAERT NV, Mortsel (BE); Electra Polymer Ltd., Tonbridge (GB)

( * ) Notice: Subject to any disclaimer, the term of this patent is extended or adjusted under 35 U.S.C. 154(b) by 237 days.

(21) Appl. No.: 16/954,588

(22) PCT Filed: Dec. 10, 2018

(86) PCT No.: PCT/EP2018/084134
§ 371 (c)(1),
(2) Date: Jun. 17, 2020

(87) PCT Pub. No.: WO2019/121093
PCT Pub. Date: Jun. 27, 2019

(65) Prior Publication Data
US 2020/0332141 A1    Oct. 22, 2020

(30) Foreign Application Priority Data

Dec. 18, 2017    (EP) .................................. 17208239

(51) Int. Cl.
| | |
|---|---|
| C09D 11/38 | (2014.01) |
| C08F 220/28 | (2006.01) |
| C08F 2/50 | (2006.01) |
| C08F 220/32 | (2006.01) |
| C08K 5/11 | (2006.01) |
| C08K 5/45 | (2006.01) |
| C09D 11/36 | (2014.01) |
| H05K 3/34 | (2006.01) |
| B41M 7/00 | (2006.01) |

(52) U.S. Cl.
CPC ............... *C09D 11/38* (2013.01); *C08F 2/50* (2013.01); *C08F 220/282* (2020.02); *C08F 220/32* (2013.01); *C08K 5/11* (2013.01); *C08K 5/45* (2013.01); *C09D 11/36* (2013.01); *H05K 3/3452* (2013.01); *B41M 7/0081* (2013.01)

(58) Field of Classification Search
CPC ...... H05K 3/3452; B41M 7/0081; C08F 2/50; C08F 220/282; C08F 220/32; C09D 11/101; C09D 11/38; C09D 11/36; C09D 11/30; C08K 5/11; C08K 5/45
See application file for complete search history.

(56) References Cited

U.S. PATENT DOCUMENTS

| | | | |
|---|---|---|---|
| 7,553,891 B2 | 6/2009 | Hoshio et al. | |
| 7,615,334 B2* | 11/2009 | Kim | H05K 3/061 |
| | | | 430/283.1 |
| 7,964,248 B2* | 6/2011 | Fong | C07C 381/12 |
| | | | 522/15 |
| 8,273,805 B2 | 9/2012 | Satou et al. | |
| 2003/0022958 A1 | 1/2003 | Watanabe et al. | |
| 2005/0165126 A1* | 7/2005 | Herlihy | C08K 5/45 |
| | | | 549/27 |
| 2005/0176969 A1 | 8/2005 | Herlihy et al. | |
| 2006/0019077 A1* | 1/2006 | Hopper | C09D 11/30 |
| | | | 428/209 |
| 2006/0058412 A1 | 3/2006 | Kakinuma et al. | |
| 2007/0224540 A1 | 9/2007 | Kamimura et al. | |
| 2008/0138536 A1 | 6/2008 | Herlihy et al. | |
| 2011/0000878 A1* | 1/2011 | Grant | C09D 11/30 |
| | | | 524/588 |
| 2011/0008547 A1* | 1/2011 | Grant | B41J 2/01 |
| | | | 427/500 |

FOREIGN PATENT DOCUMENTS

| | | |
|---|---|---|
| CN | 1225109 A | 8/1999 |
| EP | 2738226 A1 | 6/2014 |
| JP | 2002-040632 A | 2/2002 |
| WO | WO 1998/002493 A1 | 1/1998 |
| WO | WO 2004/099272 A1 | 11/2004 |
| WO | WO 2006/093680 A1 | 9/2006 |
| WO | WO 2013/015125 A1 | 1/2013 |

OTHER PUBLICATIONS

European Patent Office, International Search Report in International Patent Application No. PCT/EP2018/084134, dated Feb. 19, 2019, 3 pp.
European Patent Office, Written Opinion in International Patent Application No. PCT/EP2018/084134, dated Feb. 19, 2019, 6 pp.
The International Bureau of WIPO, International Preliminary Report on Patentability in International Patent Application No. PCT/EP2018/084134, dated Jun. 23, 2020, 7 pp.
Yuanyuan, Li ed., "New Material Science and Technology, Volume of Metal Material," 1st edition, p. 137, South China University of Technology Press (Sep. 2012).

* cited by examiner

Primary Examiner — Sanza L. McClendon
(74) Attorney, Agent, or Firm — Leydig, Voit & Mayer, Ltd.

(57) ABSTRACT

A method of manufacturing an electronic device includes preparing a solder mask with a radiation curable solder mask inkjet ink containing at least one cationic polymerizable compound and a photoinitiating system, wherein the photoinitiating system includes a specified sulphonium compound and a thioxanthone.

15 Claims, No Drawings

SOLDER MASK INKJET INKS FOR MANUFACTURING PRINTED CIRCUIT BOARDS

CROSS REFERENCE TO RELATED APPLICATIONS

This application is a 371 National Stage Application of PCT/EP2018/084134, filed Dec. 10, 2018. This application claims the benefit of European Application No. 17208239.8, filed Dec. 18, 2017, which is incorporated by reference herein in its entirety.

BACKGROUND OF THE INVENTION

1. Field of the Invention

The present invention relates to a solder mask inkjet ink and an inkjet method for manufacturing Printed Circuit Boards.

2. Description of the Related Art

Inkjet printing methods have been proposed to further improve the manufacturing process of Printed Circuit Boards (PCBs).

Inkjet printing methods and inkjet inks have been disclosed for legend printing in for example EP-A 2725075 (Agfa) and U.S. Pat. No. 7,845,785B2 (Markem-Imaje), and for applying an etch resist on a copper surface in for example EP-A 2809735 (Agfa) and EP-A 3000853 (Agfa).

By reducing the complexity and minimizing waste such inkjet printing methods render the manufacture of PCBs more cost effective.

Also for applying the solder mask, inkjet printing methods and inkjet inks have been disclosed in for example EP-A 1543704 (Avecia) and EP-A 1624001 (Taiyo Ink Manufacturing).

Solder masks are permanent protective coatings that perform a number of functions during the fabrication, assembly and end use of PCBs.

One of the main purposes of solder mask is to protect the circuitry from interacting with solder during the assembly process.

A solder mask also protects the laminate, holes and traces from collecting contaminants and from degrading during the service life of the PCB.

A solder mask also acts as an insulator of known dielectric property between components and traces of the PCB.

The solder mask should not increase the overall flammability of the printed circuit board.

UV curable inks are preferred for the design of solder mask inks.

Free radical polymerizable inks are fast curing and allow a high degree of crosslinking, resulting in excellent chemical resistance and mechanical properties. However, free radical polymerisable inks may suffer from high shrinkage on curing which can make compatibility with the high temperature soldering process, while maintaining all physical properties, especially challenging.

Cationic polymerizable inks do not suffer from the same degree of shrinkage and, when combined with a thermal post cure, provide very good thermal, chemical and physical resistance.

Typical cationic photoinitiators are Sulphonium and Iodonium compounds. However, curing efficiency, especially when using UV LED curing, with such photoinitiators may be not sufficient for a solder mask application.

With typical Iodonium and Sulphonium photoinitiators, the stability of the cationic ink, especially at higher temperatures, may not be sufficient.

There is still a need for designing a solder mask inkjet ink, which are able to withstand the high thermal stress induced during the soldering process in the manufacture of PCBs.

SUMMARY OF THE INVENTION

It is an object of the invention to provide a stable solder mask inkjet ink for manufacturing a PCB wherein a high quality solder mask, in particular withstanding the high thermal stress during the soldering process while maintaining excellent physical properties, may be produced.

The object of the invention is realized by the solder mask inkjet ink defined below.

Further objects of the invention will become apparent from the description hereinafter.

DETAILED DESCRIPTION OF THE PREFERRED EMBODIMENTS

Definitions

The term "monofunctional" in e.g. monofunctional polymerizable compound means that the polymerizable compound includes one polymerizable group.

The term "difunctional" in e.g. difunctional polymerizable compound means that the polymerizable compound includes two polymerizable groups.

The term "polyfunctional" in e.g. polyfunctional polymerizable compound means that the polymerizable compound includes more than two polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted alkaryl group is preferably a $C_7$ to $C_{20}$-alkyl group including a phenyl group or naphthyl group.

Unless otherwise specified a substituted or unsubstituted aryl group is preferably a phenyl group or naphthyl group.

Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —NO$_2$.

Manufacture of an Electronic Device

The method of manufacturing an electronic device according to the present invention includes the steps of:
- jetting a radiation curable solder mask inkjet ink as described below on a dielectric substrate containing an electrically conductive pattern; and
- curing the jetted solder mask inkjet ink.

The electronic device is preferably a Printed Circuit Board.

The radiation curable solder mask inkjet ink may be cured by exposing the ink to actinic radiation, such as electron beam or ultraviolet (UV) radiation.

Preferably the radiation curable inkjet ink is cured by UV radiation, more preferably using UV LED curing.

The method preferably includes a thermal treatment. The thermal treatment is preferably carried out after the curing step.

In a preferred embodiment the thermal treatment is carried out at a temperature from 80° C. to 250° C. The temperature is preferably not less than 100° C., more preferably not less than 120° C. To prevent charring of the solder mask, the temperature is preferably not greater than 200° C., more preferably not greater than 160° C.

The thermal treatment is typically carried out between 15 and 90 minutes.

The purpose of the thermal treatment is to further increase the polymerization degree of the solder mask.

This further polymerization during the thermal treatment may be accelerated by adding radical initiators, blocked thermal acid generators, blocked acid catalysts and/or thermosetting compounds which promote thermal curing of polymers, such as peroxides, azo compounds, acid anhydrides, and phenolics, to the solder mask inkjet ink.

The dielectric substrate of the electronic device may be any non-conductive material. The substrate is typically a paper/resin composite or a resin/fibre glass composite, a ceramic substrate, a polyester or a polyimide.

The electrically conductive pattern is typically made from any metal or alloy which is conventionally used for preparing electronic devices such as gold, silver, palladium, nickel/gold, nickel, tin, tin/lead, aluminium, tin/aluminium and copper. The electrically conductive pattern is preferably made from copper.

Radiation Curable Inkjet Ink

The radiation curable inkjet ink comprises at least one cationic polymerizable compound and a photoinitiating system as described below.

The radiation curable solder mask inkjet ink may further comprise other polymerizable compounds, adhesion promoting compounds, colorants, polymeric dispersants, a polymerization inhibitor, flame retardants, or a surfactant.

The solder mask inkjet ink may be cured with e-beam but is preferably cured with UV radiation, more preferably with UV radiation from UV LEDs. The solder mask inkjet ink is thus preferably a UV curable inkjet ink.

For reliable industrial inkjet printing, the viscosity of the radiation curable inkjet inks is preferably no more than 20 mPa·s at 45° C., more preferably between 1 and 18 mPa·s at 45° C., and most preferably between 4 and 14 mPa·s at 45° C.

For good image quality and adhesion, the surface tension of the radiation curable inkjet ink is preferably in the range of 18 to 70 mN/m at 25° C., more preferably in the range of 20 to 40 mN/m at 25° C.

Photoinitiating Systems

The photoinitiating system includes a sulphonium compound according to Formula I and a thioxanthone.

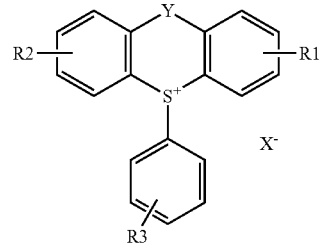

Formula I wherein

Y is selected from S, O, —CH$_2$—, CO, NR4;

R4 is selected from H, a substituted or unsubstituted alkyl group and a substituted or unsubstituted aryl group;

R1, R2 and R3 are independently selected from the group consisting of H, a substituted or unsubstituted C1-C6 linear or branched alkyl group, a substituted or unsubstituted cycloalkyl group, a substituted or unsubstituted aryl group, a substituted or unsubstituted O-alkyl group, a hydroxyl group, a halogen, a substituted or unsubstituted S-alkyl group, a substituted or unsubstituted S-aryl group, a NR5R6 group, R5 and R6 are independently selected from the group consisting of H, a substituted or unsubstituted linear or branched alkyl group, a substituted or unsubstituted cycloalkyl group, a substituted or unsubstituted aryl group, X is a group of the general formula MQ$_p$;

M is B, P, As or Sb;

Q is F, Cl, Br, I, or perfluorophenyl; and p is an integer from 4 to 6.

The sulphonium compound according to Formula I may also be referred to as a thioxanthenium compound.

Y is preferably S or O.

R1 and R2 are preferably selected from the group consisting of H, a substituted or unsubstituted C1-C6 linear or branched alkyl group, and a halogen.

R3 is preferably a substituted or unsubstituted aryl group, more preferably a substituted or unsubstituted phenyl group.

The sulphonium compound according to Formula I is a cationic photoinitiator while the thioxanthone compound is a radical photoinitiator.

A cationic photoinitiator is a chemical compound that initiates polymerisation of suitable monomers, oligomers and prepolymers, such as those containing at least one epoxy, oxetane or vinyl ether group, when exposed to actinic radiation by the generation of a Brönsted acid.

A radical photoinitiator is a chemical compound that initiates polymerization of monomers and oligomers when exposed to actinic radiation by the formation of a free radical.

Other preferred sulphonium compounds according to Formula I are disclosed in for example WO2003072567 and US2008138536.

Two of more sulphonium compounds according to Formula I may be coupled to each other as disclosed in WO2003072568 and WO2004055000.

A particularly preferred sulphonium compound is a compound according to the following formula

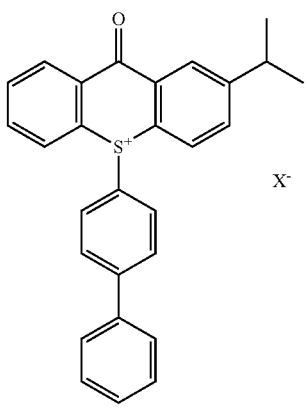 [SMILES: CC(C)c1ccc2c(c1)c(=O)c1ccccc1[s+]2-c1ccc(-c2ccccc2)cc1 ; "X-"]

wherein
X⁻ has the same meaning as above.

A commercially available sulphonium compound according to Formula I is Omnicat®550 (10-biphenyl-4-yl-2-isopropyl-9-oxo-9H-thioxanthen-10-ium hexafluorphosphate) available from IGM resins.

The inkjet ink also comprises a thioxanthone or derivative thereof.

Preferred thioxanthones are listed in the following Table 1.

TABLE 1

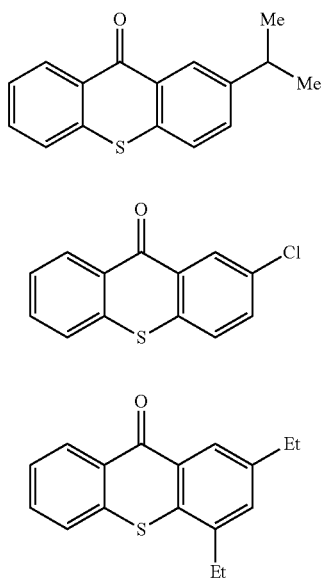

A preferred amount of the sulphonium compound according to Formula I is 0.01-20 wt %, more preferably 0.1-10 wt %, and most preferably 0.5-5 wt % relative to the total weight of the radiation curable inkjet ink.

A preferred amount of the thioxanthone 0.01-20 wt %, more preferably 0.1-10 wt %, and most preferably 0.5-5 wt % of the total weight of the radiation curable inkjet ink.

Polymerizable Compounds

The solder mask inkjet ink contains at least one cationic polymerizable compound. The inkjet ink may also contain a radical polymerizable compound.

Cationic Polymerizable Compounds

The cationic polymerizable compounds may be monomers, oligomers and/or prepolymers.

These monomers, oligomers and/or prepolymers may possess different degrees of functionality. A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or prepolymer includes at least one epoxy, at least one vinyl ether, or at least one oxetane group as polymerizable group.

Examples of monomers, oligomers or prepolymers containing at least one epoxide group include cycloaliphatic epoxy compounds such as bis-(3,4-epoxycyclohexyl)-adipate, 3,4-epoxycyclohexylmethyl-3,4-epoxycyclohexane carboxylate, poly[(2-oxiranyl)-1,2-cyclohexanediol]-2- ethyl-2-(hydroxymethyl)-1,3-propanediol ether, 7-oxabicyclo[4.1.0]hept-3-ylmethyl 7-oxabicyclo[4.1.0] heptane-3-carboxylate; ether derivatives including diol derivatives such as 1,4-butanediol diglycidylether and neopentyl glycol diglycidylether; glycidyl ethers such as n-butyl glycidyl ether, distilled butyl glycidyl ether, 2-ethylhexyl glycidyl ether, C8-C10 aliphatic glycidyl ether, C12-C14 aliphatic glycidyl ether, o-cresyl glycidyl ether, p-tertiary butyl phenyl glycidyl ether, nonyl phenyl glycidyl ether, phenyl glycidyl ether, cyclohexanedimethanol diglycidyl ether, polypropylene glycol diglycidyl ether, poly glycol diglycidyl ether, dibromo neopentyl glycol diglycidyl ether, trimethylopropane triglycidyl ether, castor oil triglycidyl ether, propoxylated glycerin triglycidyl ether, sorbitol polyglycidyl ether, glycidyl ester of neodecanoic acid; and glycidyl amines such as epoxidized meta-xylene diamine.

Examples of monomers, oligomers or prepolymers containing at least one vinyl ether group include bis[4-(vinyloxy)butyl] 1,6-hexanediylbiscarbamate, bis[4-(vinyloxy)butyl] isophthalate, bis[4-(vinyloxy)butyl] (methylenedi-4,1-phenylene)-biscarbamate, bis[4-(vinyloxy)butyl] succinate, bis[4-(vinyloxy)butyl]terephthalate, 2-(2-vinyloxyethoxy)ethyl acrylate, bis[4-(vinyloxymethyl)cyclohexylmethyl] glutarate, 1,4-butanediol divinyl ether, 1,4-butanediol vinyl ether, butyl vinyl ether, tert-butyl vinyl ether, 2-chloroethyl vinyl ether, 1,4-cyclohexanedimethanol divinyl ether, 1,4-cyclohexanedimethanol vinyl ether, cyclohexyl vinyl ether, di(ethylene glycol) divinyl ether, di(ethylene glycol) vinyl ether, trimethylolpropane trivinyl ether, diethyl vinyl orthoformate, dodecyl vinyl ether, ethylene glycol vinyl ether, triethyleneglycol divinyl ether, 2-ethylhexyl vinyl ether, ethyl-1-propenyl ether, ethyl vinyl ether, isobutyl vinyl ether, phenyl vinyl ether, propyl vinyl ether, tris[4-(vinyloxy)butyl] trimellitate.

Examples of monomers, oligomers or prepolymers containing at least one oxetane group include 3,3'-oxybis(methylene)bis(3-ethyloxetane), 1,4-bis(((3-ethyloxetan-3-yl)methoxy)methyl)benzene, 3-ethyl-3-[(phenylmethoxy)methyl]-oxetane, 3-ethyl-3-[(2-ethylhexyloxy)25 methyl] oxetane and bis[1-Ethyl(3-oxetanyl)]methylether.

Preferred cationic polymerizable compounds are selected from the group consisting of 7-oxabicyclo [4.1.0] hept-3-ylmethyl 7-oxabicyclo [4.1.0] heptane-3-carboxylate, bis[1-Ethyl(3-oxetanyl)]methylether, Poly [(2-oxiranyl)-1,2-cyclohexanediol]-2-ethyl-2-(hydroxymethyl)-1,3-propanediol ether, 2-(2)vinyloxyethoxy-ethyl acrylate, 1,4-cyclohexanedimethanol divinyl ether, trimethylol-propane trivinyl ether, triethyleneglycol divinyl ether, 3-ethyl-3-[(phenylmethoxy)methyl]-oxetane and bis[1-ethyl(3-oxetanyl)]methyl ether.

In another preferred embodiment, the radiation curable inkjet ink comprises a monomer containing a vinyl ether group and an acrylate or methacrylate group. Such monomers are disclosed in EP-A 2848659, paragraphs [0099] to [0104]). A particular preferred monomer containing a vinyl ether group and an acrylate group is 2-(2-vinyloxyethoxy) ethyl acrylate.

In a particularly preferred embodiment the inkjet ink comprises a combination of a monomer containing a vinyl ether group and an acrylate or methacrylate group as described above and of the cycloaliphatic epoxy compounds as described above.

Free Radical Polymerizable Compounds

The inkjet may also comprise radical polymerizable compounds. These may be monomers, oligomers and/or prepolymers. Monomers are also referred to as diluents.

These monomers, oligomers and/or prepolymers may possess different degrees of functionality. A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or polymer includes at least one acrylate group as polymerizable group.

Preferred monomers and oligomers are those listed in paragraphs [0106] to [0115] in EP-A 1911814.

It has been observed that combining a radical polymerizable acrylate or methacrylate compound and a cationic polymerizable compound as described above may result in improved properties, for example solder resistance, of cured inkjet inks comprising such a combination.

Particular good results were obtained when the radiation polymerizable inkjet ink comprises a tricyclodecane dimethanol diacrylate and a cationic polymerizable compound such as 2-(2-vinyloxyethoxy)ethyl acrylate, bis[1-Ethyl(3-oxetanyl)]methylether or 3-ethyl-3-[(phenylmethoxy)methyl]-oxetane.

Polymerization Inhibitors

The radiation curable inkjet ink preferably includes at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone. t-butylcatechol, pyrogallol, 2,6-di-tert.butyl-4-methylphenol (=BHT) and phenothiazine may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™18 and Genorad™ 22 from Rahn AG; Irgastab™ UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, 5110, 5120 and 5130) and PTZ from Cytec Solvay Group.

A preferred inhibitor is Genorad™ 16 or Genorad™ 22, Genorad™ 22 being particularly preferred.

The inhibitor is preferably a polymerizable inhibitor.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Flame Retardant

The radiation curable inkjet ink may comprise a flame retardant. In principle any flame retardant may be used, as long as it does not have a negative influence on the physical properties of the solder mask obtained.

The radiation curable inkjet ink preferably comprises a flame retardant according to Formula I,

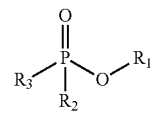

Formula I wherein
R$_1$ is independently selected from the group consisting of
a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;

$R_2$ is selected from the group consisting of $OR_4$, a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;

$R_3$ is selected from the group consisting of $OR_5$, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;

$R_4$ and $R_5$ are selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl group;

with the proviso that at least one of $R_1$ to $R_5$ represents a substituted or unsubstituted aryl group.

In a preferred embodiment, at least two of the groups $R_1$ to $R_5$ are represented by a substituted or unsubstituted aryl group.

In a most preferred embodiment, $R_1$ to $R_5$ represent a substituted or unsubstituted aryl group.

The flame retardant according to the present invention may comprise two or more functional groups selected from the group consisting of a phosphate and a phosphonate.

In a preferred embodiment, the molecular weight of the flame retardant is preferably not more than 3000, more preferably not more than 1500 and most preferably not more than 1000.

In a particularly preferred embodiment, the flame retardant according to the present invention is halogen free.

In the most preferred embodiment, the flame retardant according to the present invention is not further substituted by heteroatoms.

Another particularly preferred flame retardant according to the present invention has a chemical structure according to Formula II,

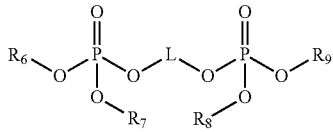

Formula II wherein

R6 to R9 independently represent a substituted or unsubstituted aryl group, and L represent a divalent linking group coupled to the phosphate groups via an aromatic carbon atom.

Preferably, the flame retardant according to Formula II is a diphosphate ester of a difunctional phenol compound selected from the group consisting of bisphenol A, bisphenol AP, bisphenol B, bisphenol BP, bisphenol C, bisphenol E, bisphenol F, bisphenol G, bisphenol M, bisphenol S, bisphenol P, bisphenol PH, bisphenol TMC, bisphenol Z and resorcinol.

R6 to R9 preferably represent a phenyl group.

Flame retardants according to the present invention are in Table 2 without being limited thereto.

TABLE 2

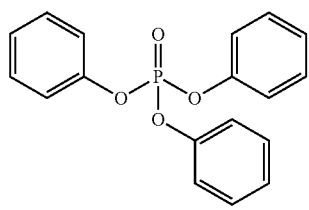 [SMILES: O=P(Oc1ccccc1)(Oc1ccccc1)Oc1ccccc1]

FR-1

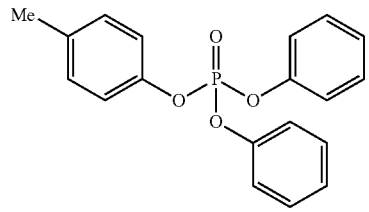 [SMILES: Cc1ccc(OP(=O)(Oc2ccccc2)Oc2ccccc2)cc1]

FR-2

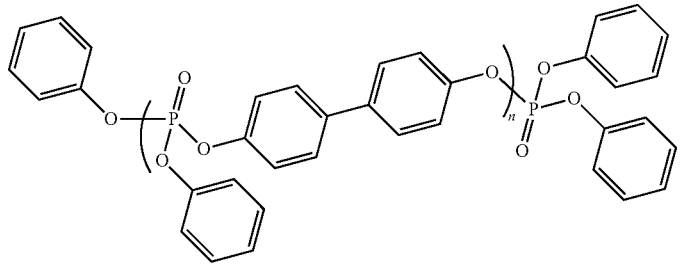

FR-3

TABLE 2-continued
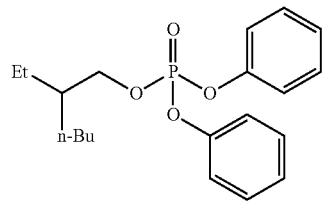
FR-4
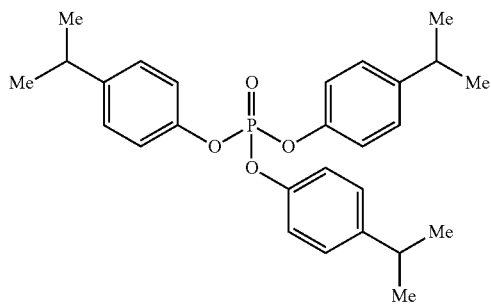 [SMILES: CC(C)c1ccc(OP(=O)(Oc2ccc(C(C)C)cc2)Oc2ccc(C(C)C)cc2)cc1]
FR-5
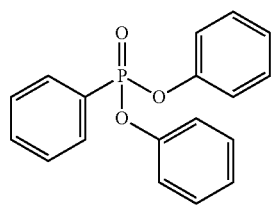 [SMILES: O=P(Oc1ccccc1)(Oc1ccccc1)c1ccccc1]
FR-6
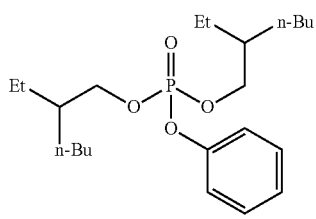
FR-7
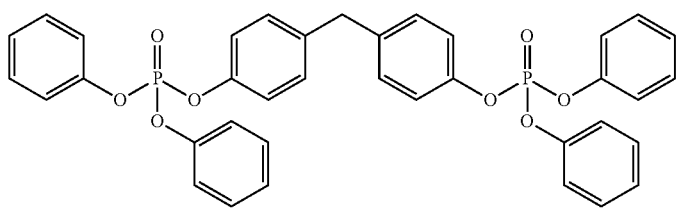 [SMILES: O=P(Oc1ccccc1)(Oc1ccccc1)Oc1ccc(Cc2ccc(OP(=O)(Oc3ccccc3)Oc3ccccc3)cc2)cc1]
FR-8
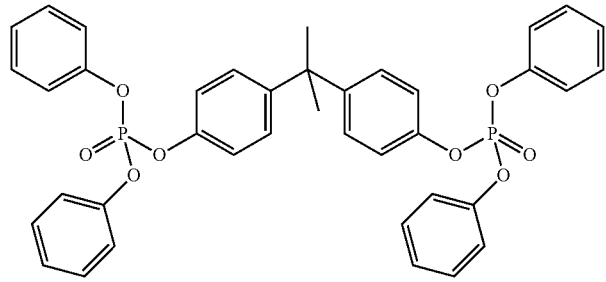 [SMILES: CC(C)(c1ccc(OP(=O)(Oc2ccccc2)Oc2ccccc2)cc1)c1ccc(OP(=O)(Oc2ccccc2)Oc2ccccc2)cc1]
FR-9

TABLE 2-continued

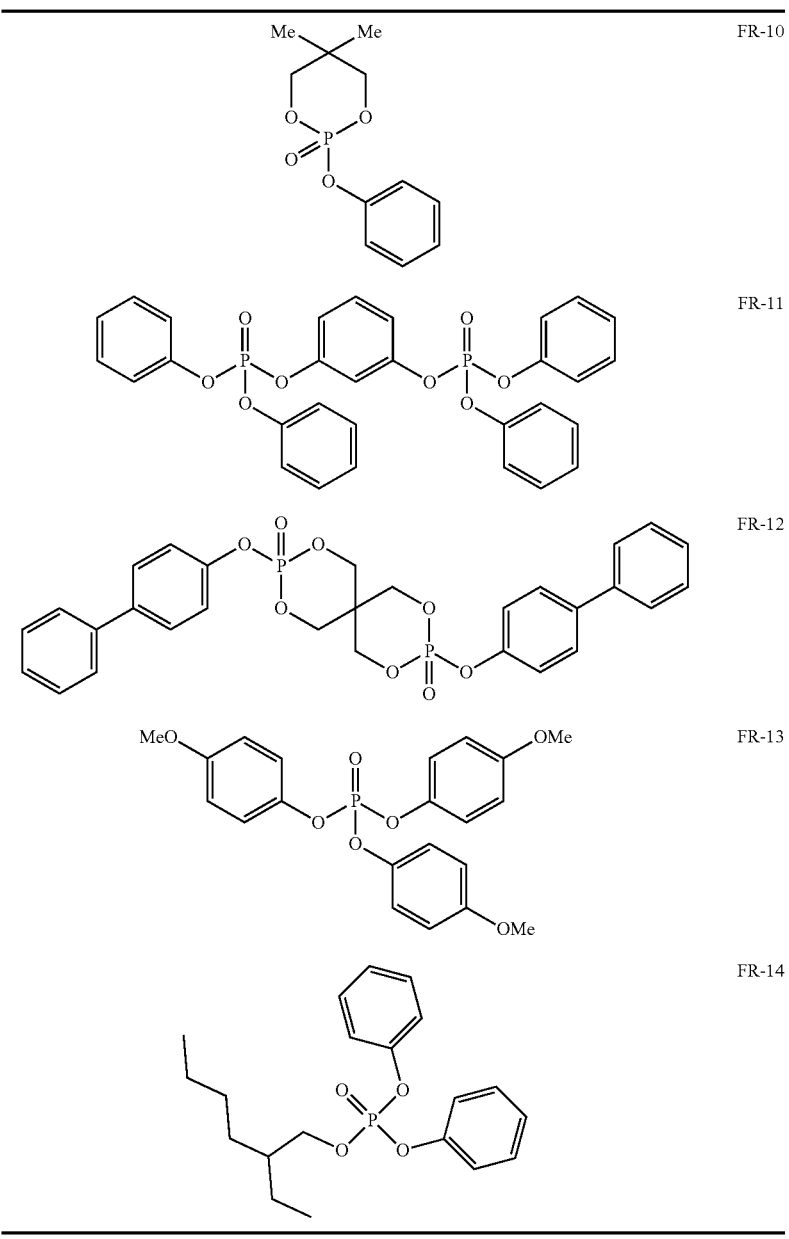

The amount of flame retardant in the radiation curable solder mask inkjet ink is preferably between 0.25 and 20 wt %, more preferably between 1 and 15 wt %, most preferably between 1 and 10 wt %, relative to the total weight of the inkjet ink.

The radiation curable inkjet may in addition to the flame retardants described above comprise other flame retardants.

Colorants

The solder mask inkjet ink may be a substantially colourless inkjet ink, but preferably the radiation curable inkjet includes at least one colorant.

The colorant in the solder mask inkjet ink may be a pigment or a dye, but is preferably a pigment.

A colour pigment may be chosen from those disclosed by HERBST, Willy, et al. Industrial Organic Pigments, Production, Properties, Applications, 3rd edition. Wiley—VCH, 2004, ISBN 3527305769.

Suitable pigments are disclosed in paragraphs [0128] to [0138] of WO2008/074548.

Pigment particles in inkjet inks should be sufficiently small to permit free flow of the ink through the inkjet-printing device, especially at the ejecting nozzles. It is also desirable to use small particles for maximum colour strength and to slow down sedimentation. Most preferably, the average pigment particle size is no larger than 150 nm. The average particle size of pigment particles is preferably determined with a Brookhaven Instruments Particle Sizer BI90plus based upon the principle of dynamic light scattering.

In PCBs, the solder mask typically has a blue or green colour. The blue pigment is preferably one of the phthalocyanine series. Examples of blue pigments are C.I. Pigment Blue 1, 15, 15:1, 15:2, 15:3, 15:4, 15:6, 16, 24 and 60.

Green pigments are generally a mixture of blue and yellow or orange pigments or may be green pigments per se, such as halogenated phthalocyanines, for example copper or nickel brominated phthalocyanine.

In a preferred embodiment, the colorant is present in an amount of 0.2 to 6.0 wt %, more preferably 0.5 to 2.5 wt %, based on the total weight of the radiation curable inkjet ink.

Polymeric Dispersants

If the colorant in the radiation curable inkjet is a pigment, then the radiation curable inkjet ink preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:
- statistically polymerized monomers (e.g. monomers A and B polymerized into ABBAABAB);
- alternating polymerized monomers (e.g. monomers A and B polymerized into ABABABAB);
- gradient (tapered) polymerized monomers (e.g. monomers A and B polymerized into AAABAABBABBB);
- block copolymers (e.g. monomers A and B polymerized into AAAAABBBBBB) wherein the block length of each of the blocks (2, 3, 4, 5 or even more) is important for the dispersion capability of the polymeric dispersant;
- graft copolymers (graft copolymers consist of a polymeric backbone with polymeric side chains attached to the backbone); and
- mixed forms of these polymers, e.g. blocky gradient copolymers.

Suitable polymeric dispersants are listed in the section on "Dispersants", more specifically [0064] to [0070] and [0074] to [0077], in EP-A 1911814.

Commercial examples of polymeric dispersants are the following:
- DISPERBYK™ dispersants available from BYK CHEMIE GMBH;
- SOLSPERSE™ dispersants available from NOVEON;
- TEGO™ DISPERS™ dispersants from EVONIK;
- EDAPLAN™ dispersants from MUNZING CHEMIE;
- ETHACRYL™ dispersants from LYONDELL;
- GANEX™ dispersants from ISP;
- DISPEX™ and EFKA™ dispersants from CIBA SPECIALTY CHEMICALS INC;
- DISPONER™ dispersants from DEUCHEM; and
- JONCRYL™ dispersants from JOHNSON POLYMER.

Surfactants

The radiation curable inkjet may contain at least one surfactant.

The surfactant can be anionic, cationic, non-ionic, or zwitter-ionic and is usually added in a total quantity less than 1 wt % based on the total weight of the radiation curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoric surfactants (such as fluorinated hydrocarbons) and silicone surfactants. The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie and Tego Rad 2100 from Evonik Industries.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preferably the surfactant is present in the radiation curable inkjet ink in an amount of 0 to 3 wt % based on the total weight of the radiation curable inkjet ink.

Preparation of Inkjet Inks

The preparation of pigmented radiation curable inkjet inks is well-known to the skilled person. Preferred methods of preparation are disclosed in paragraphs [0076] to [0085] of WO2011/069943.

Inkjet Printing Devices

The radiation curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiver surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiver surface. In a single pass printing process the inkjet print heads usually remain stationary and the ink-receiver surface is transported under the inkjet print heads.

Curing Devices

The radiation curable inkjet ink can be cured by exposing them to actinic radiation, such as electron beam or ultraviolet radiation. Preferably the radiation curable inkjet ink is cured by ultraviolet radiation, more preferably using UV LED curing.

In inkjet printing, the curing means may be arranged in combination with the print head of the inkjet printer, travelling therewith so that the curable liquid is exposed to curing radiation very shortly after been jetted.

In such an arrangement, with the exception of UV LEDs, it can be difficult to provide a small enough radiation source connected to and travelling with the print head. Therefore, a static fixed radiation source may be employed, e.g. a source of curing UV-light, connected to the radiation source by means of flexible radiation conductive means such as a fibre optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
UV-A: 400 nm to 320 nm
UV-B: 320 nm to 290 nm
UV-C: 290 nm to 100 nm.

In a preferred embodiment, the radiation curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

EXAMPLES

Materials

All materials used in the following examples were readily available from standard sources such as ALDRICH CHEMICAL Co. (Belgium) and ACROS (Belgium) unless otherwise specified. The water used was deionized water.

2005 is 7-oxabicyclo [4.1.0] hept-3-ylmethyl 7-oxabicyclo [4.1.0] heptane-3-carboxylate available from IGM resins.

S-140 is 3-ethyl-3-[(phenylmethoxy)methyl]-oxetane available from LAMBSON SPECIALTY CHEMICALS.

CHDVE is 1,4-cyclohexanedimethanol divinyl ether available from Sigma-Aldrich.

221 is a bis[1-Ethyl(3-oxetanyl)]methylether available as ARON OXETANE OXT-221 from Toa Gosei Co. Ltd.

BL550 is a liquid photoinitiator blend comprising 10-biphenyl-4-yl-2-isopropyl-9-oxo-9H-thioxanthen-10-ium hexafluorphosphate (20 wt %), propylene carbonate (25 wt %) and 7-oxabicyclo[4.1.0]hept-3-ylmethyl 7-oxabicyclo [4.1.0]heptane-3-carboxylate (55 wt %) commercially available as Omnicat BL550 from IGM resins.

ITX is Speedcure™ ITX, a mixture of isopropyl thioxanthone isomers, from LAMBSON SPECIALTY CHEMICALS.

TTA3150 sol is a 50 wt % solution of TTA3150 in VEEA.

TTA3150 is Poly [(2-oxiranyl)-1,2-cyclohexanediol]-2-ethyl-2-(hydroxymethyl)-1,3-propanediol ether available from Jiangsu Tetrachem.

VEEA is 2-(vinylethoxy)ethyl acrylate available from NIPPON SHOKUBAI, Japan.

DETX is Diethyl thioxanthone from Nippon Kayaku.

938 sol is a 20% solution in 2005/propylene carbonate of Speedcure 938.

938_50 sol is a 50% solution in propylene carbonate of Speedcure 938.

Speedcure 938 is a Bis(4-tert-butylphenyl)iodonium Hexafluorophosphate, a cationic photoinitiator available from LAMBSON SPECIALTY CHEMICALS.

Speedcure 902D is a 40% solution of a mixture of triarylsulphonium hexafluorophosphate salts in a glycidyl ether reactive diluent, a cationic photoinitiator available from LAMBSON SPECIALTY CHEMICALS.

Speedcure 976 is a 50% solution of a mixture of triarylsulphonium hexafluoroantimonate salts in propylene carbonate, a cationic photoinitiator available from LAMBSON SPECIALTY CHEMICALS.

992 sol is a 20% solution in 2005/propylene carbonate of Speedcure 992.

Speedcure 992 is a 40% solution of a mixture of triarylsulphonium hexafluorophosphate salts in propylene carbonate, a cationic photoinitiator available from LAMBSON SPECIALTY CHEMICALS.

G16 is Genorad™ 16 available from Rahn AG.

T2100sol is a 5 wt % solution of T2100 in VEEA.

T2100 is a polysiloxane acrylate slip agent available as Tego® Rad 2100 from Evonik Industries.

INHIB is a mixture forming a polymerization inhibitor having a composition according to Table 3.

TABLE 3

| Component | wt % |
| --- | --- |
| DPGDA | 82.4 |
| p-methoxyphenol | 4.0 |
| 2,6-di-tert-butyl-4-methylphenol | 10.0 |
| Cupferron™ AL | 3.6 |

Cupferron™ AL is aluminum N-nitrosophenylhydroxylamine from WAKO CHEMICALS LTD.

Ebecryl 1360 AK is a polysiloxane hexa acrylate slip agent from ALLNEX.

DPGDA is dipropylenediacrylate, available as Sartomer SR508 from ARKEMA.

833S is tricyclodecane dimethanol diacrylate commercially available as Sartomer 833S from Sartomer Cyan is SUN FAST BLUE 15:4, a cyan pigment available from SUN CHEMICALS.

Yellow is CROMOPHTAL YELLOW D 1085J, a yellow pigment from BASF.

Disperbyk 162 is a dispersing agent and has been precipitated from a solution available from BYK (ALTANA).

Methods

Coatings/Prints of the Solder Mask Inkjet Inks

To evaluate UV curing, adhesion, solvent and solder resistance of the solder mask inkjet inks, the inks were coated on a brushed copper foil (35μ) at a coating thickness of 25μ and UV cured. Additionally, the coatings were thermally cured at 150° C. during 60 minutes.

The coated inkjet inks were evaluated after UV curing for cure speed/curing efficiency and for final properties such as adhesion and solvent resistance after thermal cure.

Curing Efficiency of Solder Mask Inkjet Inks

The coated inkjet inks were evaluated by eye and touch after UV curing for cure speed and given a rating from 1 (very dry) to 5 (wet).

X-Hatch Adhesion

X-hatch adhesion was measured by cutting a 4×4 grid pattern in the soldermask coating using a scalpel. Grid cuts were spaced 1 mm apart. After cutting the grid, the adhesion was evaluated by applying a self-adhesive tape (Scotch 600) to the surface and removing by hand.

A visual evaluation resulted in an adhesion quality ranging from 1 (very good adhesion) to 5 (very poor adhesion).

Evaluation Solder Resistance

The solder resistance of the solder mask inkjet inks was evaluated using a SPL600240 Digital Dynamic Solder Pot available from L&M PRODUCTS filled with a "K" Grade 63:37 tin/lead solder available from SOLDER CONNECTION. The temperature of the solder was set at 260° C.

Using a cotton wool ball, a solder flux SC7560A from SOLDER CONNECTION was applied on the surface of the samples (i.e. coatings of the solder mask inkjet ink on a copper surface) where the X-hatch adhesion test had been carried out to clean the surface. The solder flux was dried by placing the samples for 1 minute above the solder pot.

A solder wave was created for and the samples were passed over the wave four times (5 secs/pass) after which the samples were rinsed and allowed to cool to room temperature.

The adhesion of the solder mask inkjet inks on the copper surface was then evaluated with the X-hatch adhesion method described above.

Viscosity

The viscosity of the inks was measured at 25° C. using a Brookfield DV-II+ Pro viscometer with Spindle #18 at a speed of 100 rpm.

For industrial inkjet printing, the viscosity at 25° C. using Spindle #18 at 100 rpm is preferably between 3 and 40 mPa·s. More preferably the viscosity at 45° C. and at a shear rate of 1000 $s^{-1}$ is less than 15 mPa·s.

Storage Stability

Storage stability was evaluated by measuring the increase in viscosity at 25 deg C. of the soldermask, after storage for 7 and 28 days at 60° C.

Preparation of the Cyan and Yellow Pigment Dispersions CPD and YPD

Concentrated Cyan and Yellow and pigment dispersions, respectively CPD and YPD, were prepared having a composition according to Table 5.

TABLE 5

| wt % of: | CPD | YPD |
|---|---|---|
| Cyan | 15 | — |
| Yellow | — | 15 |
| Disperbyk 162 | 15 | = |
| INHIB | 1 | = |
| VEEA | 69 | = |

CPD and YPD were prepared as follows: 138 g of 2-(2-vinyloxyethoxy)ethyl acrylate, 2 g of a solution containing 4 wt % of 4-methoxyphenol, 10 wt % of 2,6-Di-tert-butyl-4-methylphenol and 3.6 wt % of Aluminum-N-nitroso phenylhydroxyl amine in dipropylene glycol diacrylate, 200 g of a 30 wt % solution of Disperbyk 162 in 2-(2-Vinyloxyethoxy)ethyl acrylate and 60 g of Cyan (for CPD) or 60 g of Yellow (for YPD) were mixed using a DISPERLUX™ dispenser. Stirring was continued for 30 minutes. The vessel was connected to a NETZSCH MiniZeta mill filled with 900 g of 0.4 mm yttrium stabilized zirconia beads ("high wear resistant zirconia grinding media" from TOSOH Co.). The mixture was circulated over the mill for 120 minutes (residence time of 45 minutes) and a rotation speed in the mill of about 10.4 m/s. During the complete milling procedure the content in the mill was cooled to keep the temperature below 60° C. After milling, the dispersion was discharged into a vessel.

The resulting concentrated pigment dispersions CPD and YPD exhibited an average particle size of respectively 80 nm and 131 nm, as measured with a Malvern™ nano-S, and a viscosity of respectively 51 mPa·s and 114 mPa·s at 25° C. and at a shear rate of 10 $s^{-1}$.

Example 1

This example illustrates the influence of the type of photoinitiator on the stability and curing efficiency of inkjet inks containing them.

Preparation of the Radiation Curable Inks COMP-01 to COMP-04 and INV-01

The radiation curable inks COMP-01 to COMP-04 and INV-01 were prepared according to Table 6.

TABLE 6

| Ingredients (g) | COMP-01 | COMP-02 | COMP-03 | COMP-04 | INV-01 |
|---|---|---|---|---|---|
| 2005 | 15.30 | = | = | = | 10.90 |
| TTA3150sol | 10.40 | = | = | = | = |
| ITX | 1.30 | = | = | = | = |
| 902D | 5.00 | — | — | — | — |
| 976 | — | 5.00 | — | — | — |
| 992 | — | — | 5.00 | — | — |
| 938_50sol | — | — | — | 5.00 | — |
| BL550 | — | — | — | — | 9.40 |
| 2100sol | 1.20 | = | = | = | = |
| CPD | 3.15 | = | = | = | = |
| YPD | 3.15 | = | = | = | = |
| VEEA | 10.80 | = | = | = | = |
| G22 | 0.70 | = | = | = | = |
| S-140 | 16.50 | = | = | = | = |
| CHDVE | 13.70 | = | = | = | = |
| 833S | 18.8 | = | = | = | = |

The curing efficiency of the inkjet inks was tested as described above. Curing was carried out using a Phoseon FireEdge FE300 395 nm LED source to give 500 mJ/cm2, measured using an ILT390 radiometer.

The results are shown in Table 7.

TABLE 7

| UV curable ink jet ink | LED 395 nm |
|---|---|
| COMP-01 | 5 |
| COMP-02 | 5 |
| COMP-03 | 5 |
| COMP-04 | 1 |
| INV-01 | 2 |

It is clear from the results of Table 7 that radiation curable solder mask inkjet inks comprising a Iodonium salt and a sulphonium salt according to the present invention (COMP-04 and INV-01) have a much better curing efficiency than those having a triaryl sulphonium salt as photoinitiator (COMP-01 to COMP-03).

The stability of the inkjet inks was evaluated by the measuring the viscosity increase (Δvisc) of the inks after 4 and 7 days (at 60° C.). The results are shown in Table 8.

TABLE 8

| UV curable ink jet ink | Δvisc 4 days | Δvisc 7 days | Δvisc 14 days | Δvisc 21 days | Δvisc 28 days |
|---|---|---|---|---|---|
| COMP-01 | 1% | 2% | 1% | 1% | 2% |
| COMP-02 | 1% | 2% | 1% | 1% | 3% |
| COMP-03 | 0% | 0% | -2% | -2% | 1% |
| COMP-04 | 13% | 17% | 91ù | Gelled | — |
| INV-01 | 5% | 5% | 7% | 11% | 19% |

It is clear from the results of Table 8 that radiation curable solder mask inkjet inks comprising a sulphonium salt as photoinitiator (COMP-01 to COMP-03, and INV-01) have a much better stability than those containing a Iodonium salt as photoinitiator (COMP-04).

From the results described above it can be concluded that on one hand radiation curable inkjet inks comprising a Iodonium salt as photoinitiator have a good curing efficiency but a bad ink stability. On the other hand, radiation curable inkjet inks comprising well known triaryl sulphonium salts have a good ink stability but an insufficient curing efficiency. Only the radiation curable inkjet ink according to the present invention comprising a sulphonium compound according to Formula 1 is characterized by both a good curing efficiency and ink stability.

Example 2

This example illustrates the synergetic effect of using a cationic and a radical photoinitiator on the curing efficiency of a cationic inkjet ink.

Preparation of the Radiation Curable Inks COMP-05 to COMP-08 and INV-02 and INV-03

The comparative radiation curable ink COMP-05 to COMP-08 and the inventive radiation curable inkjet ink INV-02 and INV-03 were prepared according to Table 9.

TABLE 9

| Component (g) | COMP-05 | COMP-06 | INV-02 | INV-03 | COMP-07 | COMP-08 |
|---|---|---|---|---|---|---|
| 2005 | 39.16 | = | = | = | = | = |
| S-140 | 37.06 | = | = | = | = | = |
| CHDVE | 23.78 | — | — | 23.78 | 23.78 | — |
| 221 | — | 23.78 | 23.78 | — | — | 23.78 |
| BL550sol | 10.00 | 10.00 | 10.00 | 10.00 | — | — |
| ITX | — | — | 1.50 | 1.50 | 1.50 | 1.50 |

The curing efficiency of the inkjet inks was tested as described above. Curing was carried out with 395 nm LED source from UV Process Inc.

The results are shown in Table 10.

TABLE 10

| UV curable ink jet ink | LED 395 nm 60 mJ | LED 395 nm 300 mJ |
|---|---|---|
| COMP-05 | 5 | 3 |
| COMP-06 | 4 | 2 |
| INV-02 | 1 | 1 |
| INV-03 | 1 | 1 |
| COMP-07 | 5 | 5 |
| COMP-08 | 5 | 5 |

It is clear from the results of Table 10 that radiation curable solder mask inkjet inks comprising according to the present invention comprising both a cationic and a radical photoinitiator have a better curing efficiency than formulations containing only a cationic photoinitiator or only a free radical photoinitiator.

Example 3

This example illustrates the improvement in stability of inkjet inks comprising a combination of a cationic and a radical photoinitiator.

Preparation of the Radiation Curable Inks COMP-09 and COMP-10 and INV-04 and INV-05

The comparative radiation curable ink COMP-09 to COMP-11 and the inventive radiation curable inkjet ink INV-04 and INV-05 were prepared according to Table 11.

TABLE 11

| Component (wt %) | COMP-09 | COMP-10 | INV-04 | INV-05 |
|---|---|---|---|---|
| 2005 | 19.80 | 19.60 | 19.80 | 17.80 |
| TTA3150sol | 32.80 | 32.70 | 32.80 | 30.00 |
| ITX | 1.40 | 1.40 | 1.40 | — |
| DETX | — | — | — | 1.40 |
| BL550sol | — | — | 9.40 | 9.30 |
| 938sol | 9.40 | 9.30 | — | — |
| CPD | 3.00 | = | 3.00 | 3.20 |
| YPD | 1.50 | = | 1.50 | 1.60 |
| VEEA | 31.70 | = | 31.70 | 35.90 |
| G16 | 0.40 | 0.80 | 0.40 | 0.80 |

The stability of the inks was evaluated by the measuring the viscosity increase (Δvisc) of the inks after 7 and 28 days (at 60° C.). The results are shown in Table 12.

TABLE 12

| UV curable ink jet ink | Δvisc 7 days | Δvisc 28 days |
|---|---|---|
| COMP-09 | 77% | gelled |
| COMP-10 | 16% | 75% |
| INV-03 | 9% | 26% |
| INV-04 | 8% | 11% |

It is clear from the results of Table 12 that radiation curable solder mask inkjet inks according to the present invention comprising both a cationic and a radical photoinitiator have a better stability.

The invention claimed is:

1. A method of manufacturing an electronic device comprising:
   jetting a radiation curable inkjet ink onto a dielectric substrate including an electrically conductive pattern; and
   curing the radiation curable inkjet ink jetted onto the dielectric substrate; wherein
   the radiation curable inkjet ink includes a cationic polymerizable compound and a photoinitiating system including a thioxanthone and a sulphonium compound having a chemical structure according to Formula I:

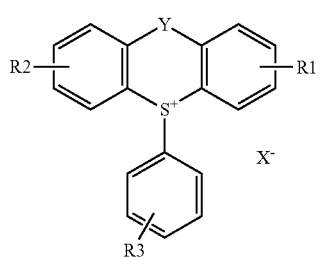

Formula I wherein
Y is selected from the group consisting of S, O, —$CH_2$—, CO, and NR4;
R4 is selected from the group consisting of H, a substituted or unsubstituted alkyl group, and a substituted or unsubstituted aryl group;
R1, R2, and R3 are independently selected from the group consisting of H, a substituted or unsubstituted C1-C6 linear or branched alkyl group, a substituted or unsubstituted cycloalkyl group, a substituted or unsubstituted aryl group, a substituted or unsubstituted O-alkyl group, a hydroxyl group, a halogen, a substituted or unsubstituted S-alkyl group, a substituted or unsubstituted S-aryl group, and a NR5R6 group;
R5 and R6 are independently selected from the group consisting of H, a substituted or unsubstituted linear or branched alkyl group, a substituted or unsubstituted cycloalkyl group, and a substituted or unsubstituted aryl group;
X is a group according to formula $MQ_p$;
M is B, P, As, or Sb;
Q is F, Cl, Br, I, or a perfluorophenyl; and
p is an integer from 4 to 6.

2. The method according to claim 1, wherein Y is O or S.

3. The method according to claim 1, wherein R1 and R2 are independently selected from the group consisting of H, a substituted or unsubstituted C1-C6 linear or branched alkyl group, and a halogen.

4. The method according to claim 1, wherein R3 is an aryl group.

5. The method according to claim 1, wherein the sulphonium compound has a chemical structure according to Formula II:

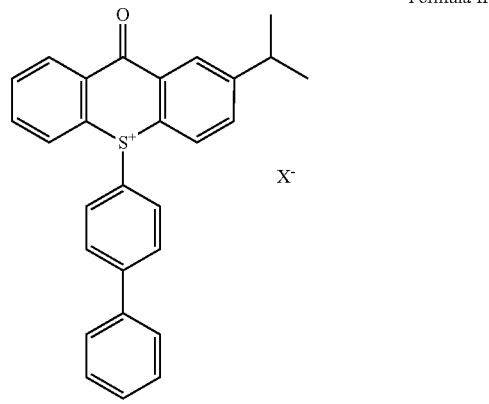

Formula II wherein
X is a group according to the formula $MQ_p$;
M is B, P, As, or Sb;
Q is F, Cl, Br, I, or a perfluorophenyl; and
p is an integer from 4 to 6.

6. The method according to claim 1, wherein the cationic polymerizable compound includes at least one epoxy, at least one vinyl ether, or at least one oxetane group.

7. The method according to claim 1, wherein the cationic polymerizable compound is selected from the group consisting of 7-oxabicyclo [4.1.0] hept-3-ylmethyl 7-oxabicyclo [4.1.0] heptane-3-carboxylate, bis[1-Ethyl(3-oxetanyl)] methylether, Poly [(2-oxiranyl)-1,2-cyclohexanediol]-2-ethyl-2-(hydroxymethyl)-1,3-propanediol ether, 2-(2)vinyloxyethoxy-ethyl acrylate, 1,4-cyclohexane-dimethanol divinyl ether, trimethylol-propane trivinyl ether, triethyleneglycol divinyl ether, 3-ethyl-3-[(phenylmethoxy)methyl]-oxetane and bis[1-ethyl(3-oxetanyl)]methyl ether.

8. The method according to claim 1, wherein the radiation curable inkjet ink further includes an inhibitor.

9. The method according to claim 1, wherein the radiation curable ink further includes an acrylate or methacrylate compound.

10. The method according to claim 9, wherein the acrylate or methacrylate compound is tricyclodecane dimethanol diacrylate.

11. The method according to claim 1, wherein the curing is performed using UV radiation.

12. The method according to claim 11, wherein the curing is performed using LED radiation.

13. The method according to claim 1, further comprising:
   heating the radiation curable inkjet ink cured on the dielectric substrate.

14. The method according to claim 13, wherein the heating is performed at a temperature between 80° C. and 250° C.

15. The method according to claim 1, wherein the electronic device is a Printed Circuit Board.

* * * * *